(12) United States Patent
Lee

(10) Patent No.: US 9,030,265 B2
(45) Date of Patent: May 12, 2015

(54) CRYSTAL OSCILLATOR

(75) Inventor: Chao-Cheng Lee, Hsinchu (TW)

(73) Assignee: Realtek Semiconductor Corp., Hsinchu (TW)

(*) Notice: Subject to any disclaimer, the term of this patent is extended or adjusted under 35 U.S.C. 154(b) by 18 days.

(21) Appl. No.: 12/856,148

(22) Filed: Aug. 13, 2010

(65) Prior Publication Data
US 2011/0037525 A1    Feb. 17, 2011

(30) Foreign Application Priority Data
Aug. 14, 2009  (TW) ................. 98127342 A

(51) Int. Cl.
*H03B 5/36*    (2006.01)
*G04F 5/06*    (2006.01)

(52) U.S. Cl.
CPC . *H03B 5/364* (2013.01); *G04F 5/06* (2013.01)

(58) Field of Classification Search
CPC ............. H03B 5/30; H03B 5/32; H03B 5/36; H03B 5/364
USPC ........... 331/116 FE, 116 M, 116 R, 154, 158, 331/160
See application file for complete search history.

(56) References Cited

U.S. PATENT DOCUMENTS

| | | | |
|---|---|---|---|
| 4,100,502 A * | 7/1978 | Yamashiro | 330/264 |
| 6,411,169 B1 * | 6/2002 | Yabe et al. | 331/116 FE |
| 6,556,094 B2 * | 4/2003 | Hasegawa et al. | 331/158 |
| 7,034,628 B1 * | 4/2006 | Lu et al. | 331/158 |
| 7,639,094 B1 * | 12/2009 | Stevenson | 331/108 C |
| 7,808,334 B2 * | 10/2010 | Yoshida et al. | 331/158 |
| 2011/0037527 A1 * | 2/2011 | Shrivastava et al. | 331/158 |

* cited by examiner

*Primary Examiner* — Levi Gannon
(74) *Attorney, Agent, or Firm* — McClure, Qualey & Rodack, LLP

(57) ABSTRACT

This invention discloses a crystal oscillator, in which by appropriately designing the gain of an amplifier to achieve high trans-conductance and low power consumption. This crystal oscillator includes a first pad, coupled to a first node of a crystal, for receiving a crystal oscillating signal outputted from the crystal; an amplifier, coupled to the first pad, for amplifying the crystal oscillating signal to generate an amplifying signal; an inverter, coupled to the amplifier, for inverting the amplifying signal; and a second pad, coupled to a second node of the crystal, for outputting an oscillating signal to the crystal.

15 Claims, 5 Drawing Sheets

CRYSTAL OSCILLATOR

BACKGROUND OF THE INVENTION

1. Field of the Invention

The invention relates to an electronic circuit, particularly to a crystal oscillator.

2. Description of the Related Art

The traditional crystal oscillator, as shown in FIG. 1, usually uses a inverter 102 to generate an oscillating signal. The trans-conductance Gm of the inverter is $$Gm = Kn \times (Wn/Ln) \times (0.5Vdd - Vtn) + Kp \times (Wp/Lp) \times (0.5Vdd - Vtp) \quad \text{equation 1}$$

In order to ensure that with all kinds of crystal Xtal, and a variety of circuit board load conditions, the crystal oscillator still be able to maintain a stable output. The trans-conductance Gm of the inverter is usually a large value. For example, trans-conductance Gm is greater than 5 mA/V. But in order to increase the inverter trans-conductance Gm in the traditional crystal oscillator, the aspect ratio (Wn/Ln, Wp/Lp) of the two NMOS and PMOS transistors of the inverter are increased respectively. And this makes the inverter to increase the power consumption. The power consumption of the inverter is:

$$I = 0.5 \times Kn \times (Wn/Ln) \times (Vdd - Vtn)^2; \text{ when input} = Vdd$$

$$I = 0.5 \times Kp \times (Wp/Lp) \times (Vdd - Vtn)^2; \text{ when input} = Vss \quad \text{equation 2}$$

Therefore, it can't both increase trans-conductance Gm and reduce power consumption in the traditional crystal oscillator.

Furthermore, with the inverter consume greater power, it is easier to interference other circuits, specifically for those noise-sensitive circuits, such as analog circuits, radio frequency circuits. And, with the technology develops continuously to the high frequency, high speed, low operating voltage, and low power consumption. For example, digital-to-analog converter (DAC); another example, Ethernet develops from 10M through 100M, 1 G, 10 G, 40 G, and other more high speed development; another example, integrated circuit process develops from 0.5 process through 0.35, 0.25, 0.18, 0.15, and 0.09 processes, that shows the important and necessary of the components with low power consumption, the less interference with other circuits.

SUMMARY OF THE INVENTION

One object of the present invention is to provide a crystal oscillator with reducing the power consumption and the less interference with other circuits.

The present invention discloses a crystal oscillator, in which by a crystal to generate an output oscillating signal to an IC. The crystal oscillator comprises a first pad, coupled to a first node of a crystal, for receiving a crystal oscillating signal outputted from the crystal; an amplifier, coupled to the first pad, for amplifying the crystal oscillating signal to generate an amplifying signal; an inverter, coupled to the amplifier, for inverting the amplifying signal; and a second pad, coupled to a second node of the crystal, for outputting an oscillating signal to the crystal. Wherein, the amplifier has a first power consumption, the inverter has a second power consumption, the first power consumption is smaller than the second power consumption.

DETAILED DESCRIPTION OF THE INVENTION

Figure 1:
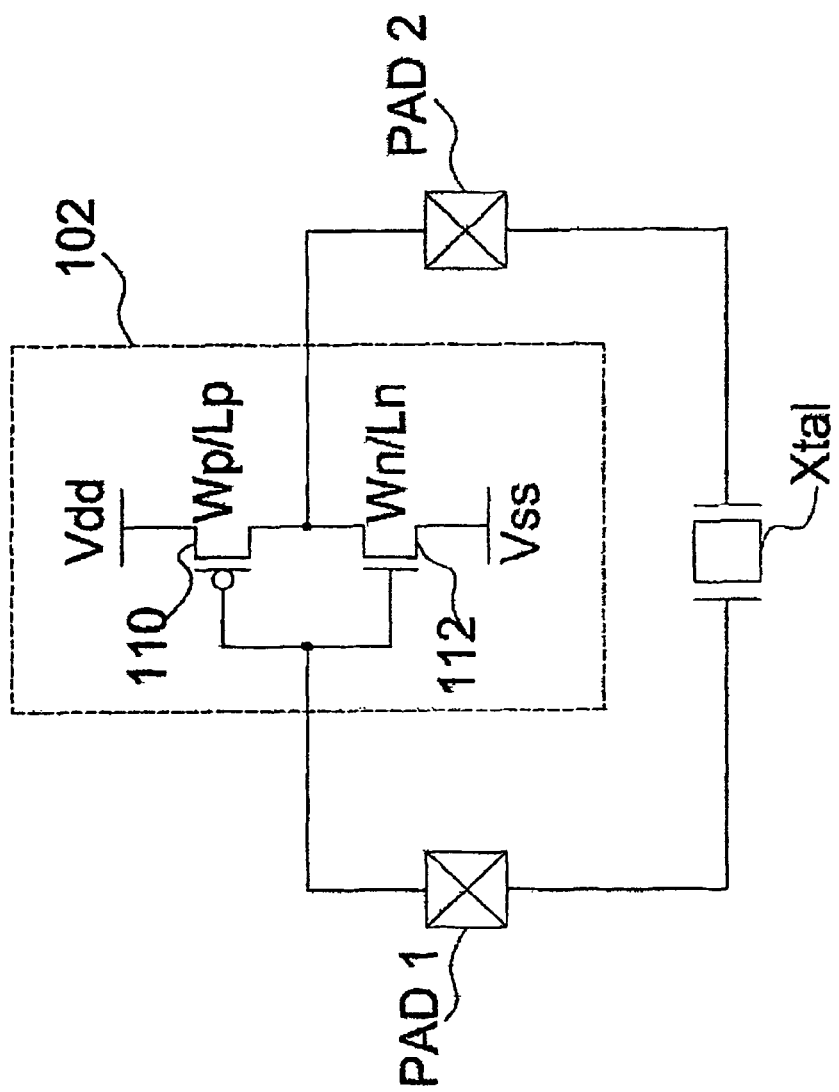
FIG. 1 shows a schematic diagram illustrating a crystal oscillator according to the prior art.
Figure 2:
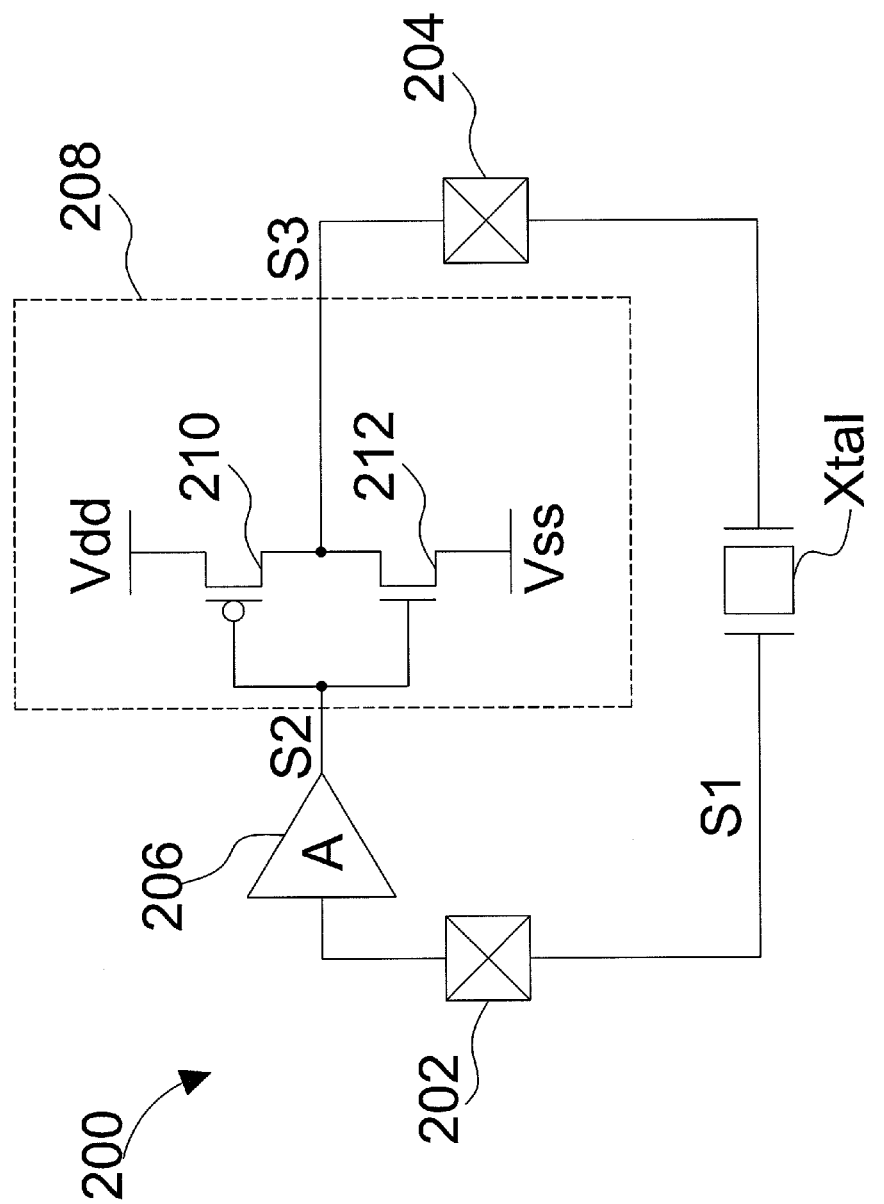
FIG. 2 shows a schematic diagram illustrating a crystal oscillator to the first embodiment of the present invention.

Please refer to FIG. 2, which shows a schematic diagram illustrating a crystal oscillator of the present invention. The crystal oscillator 200 comprises pads 202, 204, an amplifier 206, and an inverter 208. The pad 202 couples to a first node of a crystal Xtal to receive a crystal oscillating signal S1 outputted by the crystal Xtal. The amplifier 206 amplified the crystal oscillating signal S1 and generated an amplifying signal S2 to the inverter 208. Then, the inverter 208 inverts the amplifying signal S2 and generates an output oscillating signal S3 to the pad 204, so that the output oscillating signal S3 feedbacks to a second node of the crystal Xtal to form a completed feedback system.

As the circuit structure shown in FIG. 2, the invention adds an amplifier 206 between the pad 202 and the inverter 208, and the gain of the amplifier 206 is A. Therefore, after adding the amplifier 206, the trans-conductance Gm of the crystal oscillator 200 is:

$$Gm = A \times Kn \times (Wn/Ln) \times (0.5Vdd - Vtn) + A \times Kp \times (Wp/Lp) \times (0.5Vdd - Vtp) \quad \text{equation 3}$$

Wherein, Kn, Kp are trans-conductance coefficients, Wn/Ln is aspect ratio of the transistor 210, Wp/Lp is aspect ratio of the transistor 212, Vtn is threshold voltage of the transistor 212, Vtp is threshold voltage of the transistor 210, and Vdd is an operating voltage.

However, after adding the amplifier 206, the power consumption of the inverter 208 as shown in following:

$$I = 0.5 \times Kn \times (Wn/Ln) \times (Vdd - Vtn)^2; \text{ when input} = Vdd \quad \text{equation 4}$$

$$I = 0.5 \times Kp \times (Wp/Lp) \times (Vdd - Vtn)^2; \text{ when input} = Vss \quad \text{equation 5}$$

Where, Vss is an operating voltage.

According to the above equation, it is understood that the trans-conductance Gm of the crystal oscillator 200 is associated with gain A of the amplifier 206, the amplifier 206 is associated with a multiplication of aspect ratio of the transistors 210 and 212 of the inverter 208. Therefore, the present invention increases the trans-conductance Gm to ensure starting oscillation without increasing the overall power consumption by designing larger gain A.

In other words, conventional crystal oscillator need to design a very large aspect ratio of the transistors 110 and 112 for getting a larger trans-conductance Gm to ensure oscillating. However, when the aspect ratio of the transistors 110 and 112 are designed larger, the overall power consumption of the transistors 110 and 112 will increase, and the bouncing noise of the operating voltage Vdd and Vss will increase as well. Therefore, this invention designs an amplifier 206 in front of the inverter 208 and amplifies the crystal oscillating signal S1 beforehand. Thus, the aspect ratio of the transistors 210 and 212 can be smaller, the power consumption will decrease and have enough trans-conductance Gm to ensure that the circuit can oscillate.

Moreover, in order to get better power utility rate and regard to the trans-conductance Gm, the power consumption of the amplifier 206 and the inverter 208 can be properly designed. In other words, the power consumption of the amplifier 206 and the inverter 208 are different. For example, when the power consumption of the amplifier 206 is designed to $1/10~1/100$ of the inverter 208, the crystal oscillator 200 can get larger trans-conductance Gm and lower power consumption. But it is not limited to the present invention.

Figure 3:
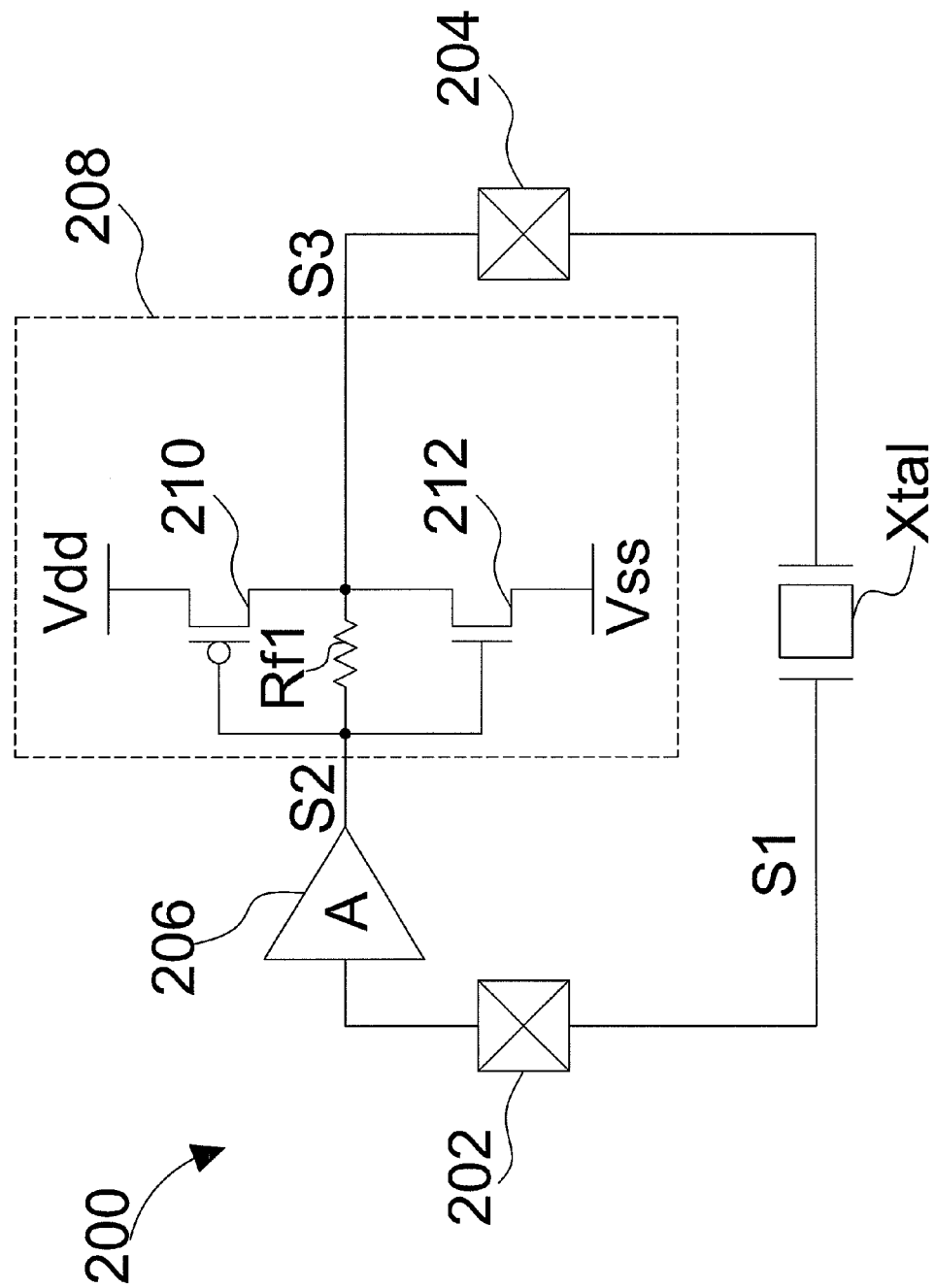
FIG. 3 shows a schematic diagram illustrating a crystal oscillator according to the second embodiment of the present invention.

Furthermore, according to an embodiment of the present invention, a feedback resistance Rf can be set between the input and output terminals of the inverter 208 to make the crystal oscillator 200 easier to start oscillating. Please refer to FIG. 3, which shows the approach of coupling the feedback resistance Rf.

Figure 4:
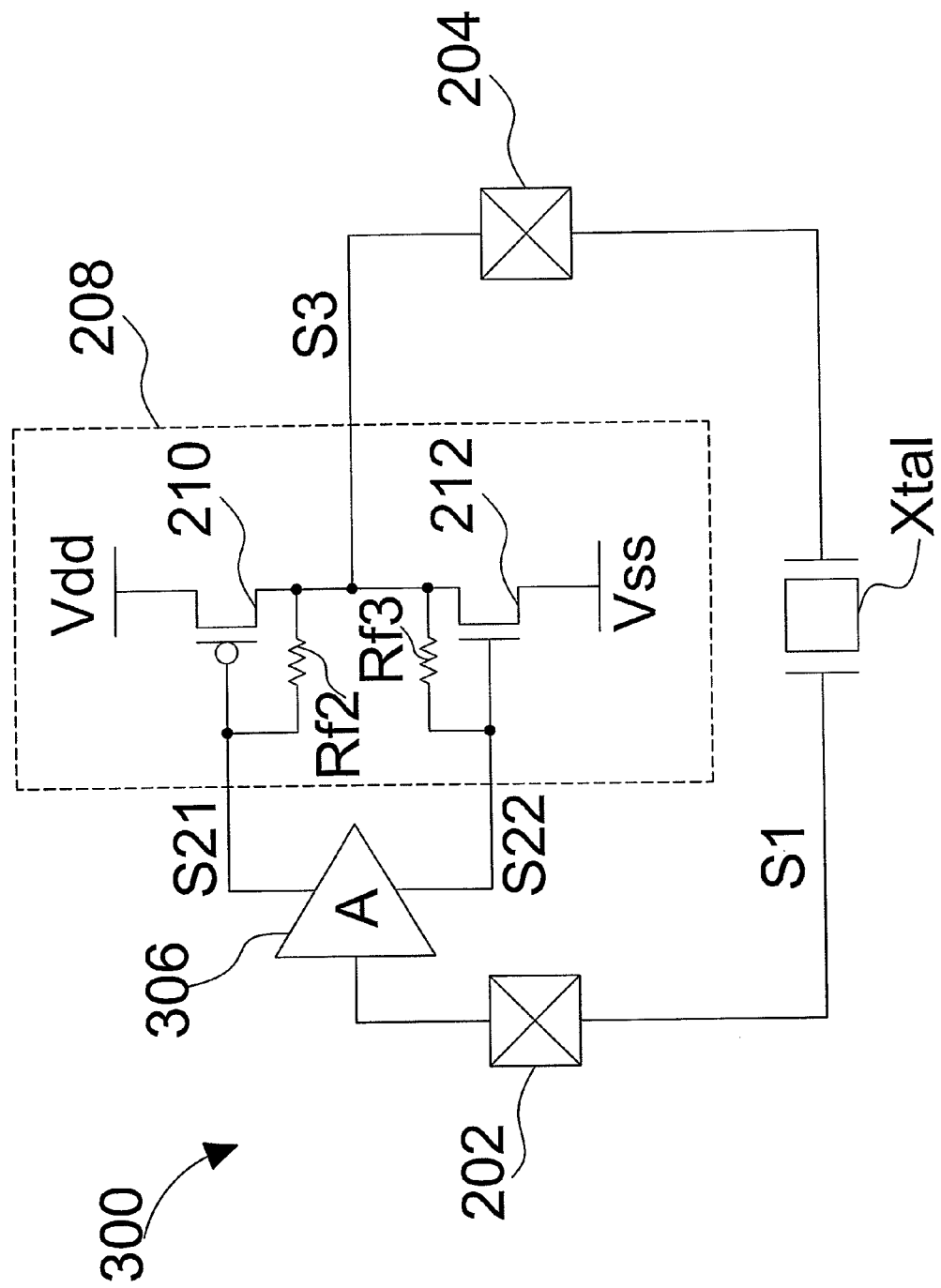
FIG. 4 shows a schematic diagram illustrating a crystal oscillator according to the third embodiment of the present invention.
Figure 5:
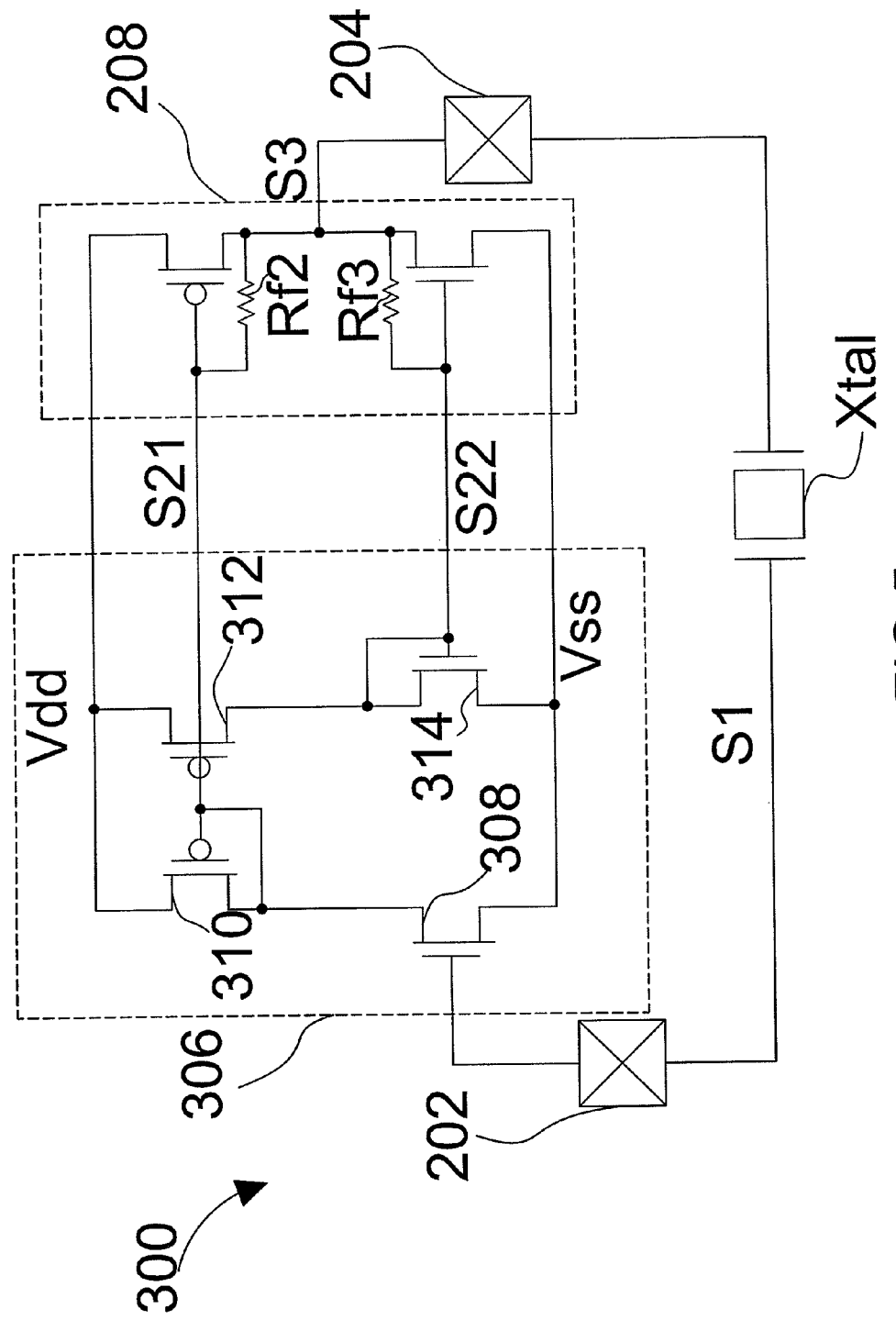
FIG. 5 shows a schematic diagram illustrating a crystal oscillator according to the forth embodiment of the present invention.

Next, please refer to FIGS. 4 and 5, FIG. 4 shows an embodiment of the present invention of the crystal oscillator. The crystal oscillator 300 comprises pads 202, 204, an amplifier 306, an inverter 208, and feedback resistances Rf2, Rf3. The difference between this embodiment and foregoing embodiment is that the amplifier 306 is a single-to-double-ended amplifier, the details of the circuit as shown in FIG. 5. The amplifier 306 comprises a NMOS transistors 308, 314 and PMOS transistors 310, 312. Wherein, the gate of the NMOS transistors 308 receives the crystal oscillating signal S1, the source of the NMOS transistor 308 couples to the operating voltage Vss. The drain of PMOS transistor 310 couples to the drain of the NMOS transistor 308, the source of PMOS transistor 310 couples to the operating voltage Vdd. The gate of the PMOS transistor 312 couples to the gate of the PMOS transistor 310, the source of the PMOS transistor 312 couples to the operating voltage Vdd. The drain of the NMOS transistor 314 couples to the drain of the PMOS transistor 312, the source of the NMOS transistor 314 couples to the operating voltage Vss. Wherein, a current mirror circuit is formed by the PMOS transistors 310, 312.

In the present embodiment, the NMOS transistor 308 of the amplifier 306 amplifies the crystal oscillating signal S1 at first, and outputs the amplified signal S21, S22 to the gates of transistors 210, 212 through current mirror as a load. Finally, the transistors 210, 212 generate the output oscillating signal S3 to pad 204 so that form a feedback system. Similar to the previous embodiment, circuit designers can appropriately design the aspect ratio of the NMOS transistors 308, 314 and the PMOS transistors 310, 312 to determine the gain A and power consumption of the amplifier 306. For example, gain A can be designed as 20 to 100, the power consumption can be designed as less than inverter 208 as well, and then the crystal oscillator 300 can be made as a high trans-conductance Gm with low power consumption characteristic. Moreover, in the present embodiment, setting feedback resistances Rf2, Rf3 between input and output terminals of inverter 208 can start oscillating of crystal oscillator 200 more easier.

Otherwise, the crystal oscillator of the present invention can be applied to various products, for example: Wired network, wireless network, monitor, TV . . . etc., the present invention should not be limited to the specific construction and arrangement. The present invention can also be applied to other related electronic products.

In view of foregoing, it is clearly understood that the crystal oscillator of the present invention sets an amplifier in front of an inverter. The amplifier provides a gain A, and the trans-conductance Gm of the crystal oscillator is associated with the gain A. Furthermore, since the amplifier provides a gain of A which multiply with the aspect ratio of the transistors. Therefore, the present invention increases the trans-conductance Gm by designing a larger gain A to initiate oscillating without consuming overall power so as to solve some problems of conventional crystal oscillator.

What is claimed is:

1. A crystal oscillator that generates an output oscillating signal by a crystal, the crystal oscillator comprising:
    a first pad and a second pad, coupled to two nodes of the crystal;
    an amplifier, coupled to the first pad, for amplifying a crystal oscillating signal received from the first pad and generating an amplifying signal, wherein the amplifier comprises:
    a first transistor, having a first gate for receiving the crystal oscillating signal, having a first source coupled to a first operating voltage;
    a second transistor, having a second drain coupled to a first drain of the first transistor, having a second source coupled to a second operating voltage;
    a third transistor, having a third gate coupled to a second gate of the second transistor, having a third source coupled to the second operating voltage; and
    a fourth transistor, having a fourth drain coupled to a third drain of the third transistor, having a fourth source coupled to the first operating voltage, wherein the second and the third transistors form a current mirror circuit, wherein the first and the fourth transistors are implemented by NMOS transistors and the second and the third transistors are implemented by PMOS transistors; and
    an inverter, coupled to the amplifier, for inverting the amplifying signal and generating the output oscillating signal,
    wherein the amplifier has a first power consumption, the inverter has a second power consumption, and the first power consumption is smaller than the second power consumption.

2. The crystal oscillator according to claim 1, wherein the amplifier is a single-to-double-ended amplifier.

3. The crystal oscillator according to claim 1, wherein the second gate of the second transistor is used as a first output terminal of the amplifier, and outputs a first amplifying signal to the inverter; and, a fourth gate of the fourth transistor is used as a second output terminal of the amplifier, and outputs a second amplifying signal to the inverter.

4. The crystal oscillator according to claim 3, wherein the inverter comprises:
    a fifth transistor, having a fifth gate received the first amplifying signal, having a fifth source coupled to the second operating voltage, having a fifth drain to output the output oscillating signal; and
    a sixth transistor, having a sixth gate received the second amplifying signal, having a sixth source coupled to the first operating voltage, having a sixth drain to output the output oscillating signal,
    wherein the fifth transistor is implemented by PMOS transistor and the sixth transistor is implemented by NMOS transistor.

5. The crystal oscillator circuit according to claim 1, wherein the inverter comprises a feedback resistance coupled between an input terminal and an output terminal of the inverter.

6. The crystal oscillator according to claim 1, wherein the inverter has a gain, the gain is between 20 and 100.

7. The crystal oscillator according to claim 1, wherein the first power consumption is substantially equal to $1/10$ of the second power consumption.

8. The crystal oscillator according to claim 1, wherein the first power consumption is substantially equal to 1/100 of the second power consumption.

9. A crystal oscillator that generates an output oscillating signal by a crystal, the crystal oscillator comprising:
- a first pad and a second pad, coupled to two nodes of the crystal;
- an amplifier, coupled to the first pad, for amplifying a crystal oscillating signal received form the first pad and generating an amplifying signal, wherein the amplifier comprises:
- a first transistor, having a first gate for receiving the crystal oscillating signal, having a first source coupled to a first operating voltage;
- a second transistor, having a second drain coupled to a first drain of the first transistor, having a second source coupled to a second operating voltage;
- a third transistor, having a third gate coupled to a second gate of the second transistor, having a third source coupled to the second operating voltage; and
- a fourth transistor, having a fourth drain coupled to a third drain of the third transistor, having a fourth source coupled to the first operating voltage, wherein the second and the third transistors form a current mirror circuit; and
- an inverter, coupled to the amplifier, for inverting the amplifying signal and generating the output oscillating signal;
- wherein the amplifier has a first power consumption, the inverter has a second power consumption, and the first power consumption is smaller than the second power consumption,
- wherein the second gate of the second transistor is used as a first output terminal of the amplifier, and outputs a first amplifying signal to the inverter, and a fourth gate of the fourth transistor is used as a second output terminal of the amplifier, and outputs a second amplifying signal to the inverter.

10. The crystal oscillator according to claim 9, wherein the amplifier is a single-to-double-ended amplifier.

11. The crystal oscillator according to claim 9, wherein the inverter comprises:
- a fifth transistor, having a fifth gate received the first amplifying signal, having a fifth source coupled to the second operating voltage, having a fifth drain to output the output oscillating signal; and
- a sixth transistor, having a sixth gate received the second amplifying signal, having a sixth source coupled to the first operating voltage, having a sixth drain to output the output oscillating signal,
- wherein the fifth transistor is implemented by PMOS transistor and the sixth transistor is implemented by NMOS transistor.

12. The crystal oscillator circuit according to claim 9, wherein the inverter comprises a feedback resistance coupled between an input terminal and an output terminal of the inverter.

13. The crystal oscillator according to claim 9, wherein the inverter has a gain, the gain is between 20 and 100.

14. The crystal oscillator according to claim 9, wherein the first power consumption is substantially equal to 1/10 of the second power consumption.

15. The crystal oscillator according to claim 9, wherein the first power consumption is substantially equal to 1/100 of the second power consumption.

* * * * *